United States Patent
McCrady et al.

(10) Patent No.: US 10,844,472 B2
(45) Date of Patent: Nov. 24, 2020

(54) METHOD OF RETROFITTING A VACUUM DEPOSITION CHAMBER

(71) Applicant: Essilor International, Charenton-le-Pont (FR)

(72) Inventors: Brian McCrady, Dallas, TX (US); Alain Mathieu, Dallas, TX (US); Cesar Maksoud, Dallas, TX (US); Todd Lane Jacobs, Dallas, TX (US)

(73) Assignee: Essilor International (Compagnie Generale d'Optique), Charenton-le-Pont (FR)

( * ) Notice: Subject to any disclaimer, the term of this patent is extended or adjusted under 35 U.S.C. 154(b) by 0 days.

(21) Appl. No.: 16/690,545

(22) Filed: Nov. 21, 2019

(65) Prior Publication Data
US 2020/0087778 A1   Mar. 19, 2020

Related U.S. Application Data

(62) Division of application No. 15/557,032, filed as application No. PCT/IB2015/000503 on Mar. 11, 2015.

(51) Int. Cl.
*C23C 14/24* (2006.01)
*C23C 14/26* (2006.01)

(52) U.S. Cl.
CPC ............ *C23C 14/243* (2013.01); *C23C 14/24* (2013.01); *C23C 14/26* (2013.01)

(58) Field of Classification Search
CPC ........ C23C 14/24; C23C 14/243; C23C 14/26
See application file for complete search history.

(56) References Cited

U.S. PATENT DOCUMENTS

| 6,183,872 | B1 | 2/2001 | Tanaka et al. |
| 2004/0072497 | A1 | 4/2004 | Hirano et al. |
| 2004/0195965 | A1* | 10/2004 | Yamazaki ........... H01L 51/5016 313/506 |
| 2006/0141169 | A1* | 6/2006 | Noguchi ............. C23C 14/0694 427/585 |

(Continued)

FOREIGN PATENT DOCUMENTS

| JP | 2005187936 | 7/2005 |
| WO | WO2004/077581 | 9/2004 |

OTHER PUBLICATIONS

Tiedje, H.F., et al., "Temperature stabilized effusion cell evaporation source for thin film deposition and molecular-beam epitaxy". Review of Scientific Instruments, vol. 71, No. 5, May 2000, pp. 2121-2124.*

(Continued)

*Primary Examiner* — Bret P Chen
(74) *Attorney, Agent, or Firm* — Norton Rose Fulbright US LLP

(57) ABSTRACT

The invention relates to a method of retrofitting a vacuum deposition chamber of an apparatus for coating optical substrates, the vacuum deposition chamber comprising a second resistance evaporator crucible. The method comprises installing a resistance evaporator comprising a crucible into the operational vacuum deposition chamber such that the crucible is disposed above the vacuum deposition chamber floor, and such that the second resistance evaporator crucible is closer to the vacuum deposition chamber floor than the installed crucible.

3 Claims, 4 Drawing Sheets

(56) References Cited

U.S. PATENT DOCUMENTS

| | | | |
|---|---|---|---|
| 2007/0251455 A1* | 11/2007 | Wan | C23C 16/4418 |
| | | | 118/724 |
| 2007/0257238 A1 | 11/2007 | Misura et al. | |
| 2008/0006779 A1* | 1/2008 | Sato | C23C 14/0694 |
| | | | 250/483.1 |
| 2010/0163550 A1 | 7/2010 | Belsh et al. | |
| 2011/0275196 A1* | 11/2011 | Eser | C23C 14/243 |
| | | | 438/478 |
| 2013/0038834 A1* | 2/2013 | Cado | G02B 1/11 |
| | | | 351/159.62 |
| 2013/0263784 A1 | 10/2013 | Lee et al. | |
| 2014/0011013 A1 | 1/2014 | Jin et al. | |

OTHER PUBLICATIONS

Hardy, Norm, "What is Thin Film Deposition by Thermal Evaporation?". Semicore Equipment, Inc. news, Sep. 30, 2013, pp. 1-3.*

Mayo, et al., "Polymer-Nanocomposite Anti-Reflective Coating Fabricated by Resonant IR Matrix-Assisted Pulsed Laser Evaporation," CLEO: 2013 Technical Digest, OSA: 1-2, 2013.

Sharma, et al., "Evaporation Rate of Water in Hydrophobic Confinement," PNAS, 109(12): 4365-4370, 2012.

Shokri, et al., "Effects of Hydrophobic Layers on Evaporation from Porous Media," Geophysical Research Letters, 35, L19407: 1-4, 2008.

Slovick, et al., "Evaporation of Uniform Antreflection Coatings on Hemispherical Lenses to Enhance Infrared Antenna Gain," Infrared Physics & Technology, 53: 89-93, 2010.

* cited by examiner

METHOD OF RETROFITTING A VACUUM DEPOSITION CHAMBER

CROSS-REFERENCE TO RELATED APPLICATIONS

This application is a divisional of U.S. application Ser. No. 15/557,032 filed 8 Sep. 2017, which is a national phase application under 35 U.S.C. § 371 of International Application No. PCT/IB2015/000503 filed 11 Mar. 2015. The entire contents of the above-referenced disclosure is specifically incorporated by reference herein without disclaimer.

FIELD OF THE INVENTION

The invention generally concerns devices, systems, and methods related to vapor deposition of substrates, and more particularly, but in no way limiting, to vapor deposition of a hydrophobic material onto optical substrates.

BACKGROUND

Multiple types of functional coatings can be applied to an optical substrate, such as eyeglass lenses. For example, it is not uncommon for a pair of eyeglass lenses to have three to four different coatings, such as an anti-reflective coating (a thin multi-layer coating that reduces light reflecting from the lenses), an anti-scratch coating, an anti-static coating, and a hydrophobic coating.

In the manufacturing of eyeglass lenses, a single machine can apply more than one of the various coatings. For example, a vapor deposition machine can be used to apply an anti-reflective coating and a hydrophobic coating to a plurality of eyeglasses. Improving the coating efficiency of such machines can be beneficial.

SUMMARY

One aspect of the present disclosure is directed to an apparatus for the vapor deposition of two or more functional layers onto a substrate, where one of the functional layers is a hydrophobic layer and the evaporation source of the hydrophobic material is closer to the substrate than one or more of the other functional layers. In some embodiments, a vapor deposition apparatus comprises: a vacuum chamber having a floor disposed in or defining a portion of the chamber; a substrate holder disposed in the vacuum chamber above the floor and configured to receive at least one substrate; a first evaporator disposed in the vacuum chamber below the substrate holder and configured to have a first evaporation source at a first vertical distance relative to the substrate. The first evaporator is configured for electron beam evaporation, ion-assisted evaporation, or ion beam sputtering; and a second evaporator disposed in the vacuum chamber below the substrate holder and configured to have a second evaporation source at a second vertical distance relative to the substrate, the second evaporator adapted for resistance evaporation or another type of evaporation suitable for a hydrophobic material so that the hydrophobic material forms a hydrophobic coating on the substrate. In some embodiments, the second vertical distance is less than 75% or less than 60% of the first vertical distance. In some embodiments, the second evaporator does not intersect with a vapor path between the first evaporator and the substrate. In some embodiments, the substrate holder is rotatable about an axis of rotation that is substantially perpendicular to the floor of the vacuum chamber. In some embodiments, the second evaporation source is closer to a wall defining the vacuum chamber than the axis of rotation of the substrate holder. In some embodiments, the second evaporator comprises a crucible and two conductive rods at least 20 cm in length, where each rod has a first end and a second end and where at least a portion of the two conductive rods extend upward relative to the floor of the vacuum chamber and the crucible is electrically coupled to each conductive rod at the first end, which is nearer the substrate than the second end. In some embodiments, the apparatus comprises a hydrophobic material disposed in the crucible. In some embodiments, the hydrophobic material is a fluoropolymer. In some embodiments, the crucible comprises one or more of molybdenum, tantalum, tungsten, copper, and steel. In some embodiments, the second evaporator is shutter-less. In some embodiments, the first evaporator is adapted to apply an anti-reflective coating. In some embodiments, a metal oxide is disposed in the first evaporation source.

Another aspect of the present disclosure is a method of vapor depositing two or more functional layers, where one of the layers is a hydrophobic coating and the evaporation source so the hydrophobic material that forms the coating is closer to the substrate than the evaporation source of one or more of the other functional layers. In some embodiments, a vacuum deposition method can comprise the steps of evaporating a first film forming material from a first evaporation source disposed in a vacuum deposition chamber; depositing the evaporated first film forming material on a substrate located above the first evaporation source to form at least a portion of an anti-reflective coating on the substrate, evaporating a second film forming material from a second evaporation source disposed in the vacuum deposition chamber; and depositing the evaporated second film forming materials on the substrate located above the second evaporation source to form a hydrophobic coating on the substrate. In some embodiments, the first evaporation source is a first vertical distance from the substrate and the second evaporation source is a second vertical distance from the substrate, where the second vertical distance is less than 75% or less than 60% of the first vertical distance. In some embodiments, the second evaporation source does not intersect with a vapor path between the first evaporation source and the substrate. In some embodiments, the substrate is disposed in a rotatable substrate holder, where the axis of rotation is substantially perpendicular to the floor of the vacuum chamber. In some embodiments, the second evaporation source is closer to an external wall of the vacuum chamber than the axis of rotation of the substrate holder. In some embodiments, the second evaporation source comprises a crucible electrically coupled to two conductive rods at least 20 cm in length, where each rod has a first end and a second end and where at least a portion of the two conductive rods extend upward relative to the floor of the vacuum chamber, the crucible being electrically coupled to each conductive rod at the first end, which is nearer the substrate than the second end. In some embodiments, the hydrophobic coating comprises a fluoropolymer. In some embodiments, the crucible comprises one or more of molybdenum, tantalum, tungsten, copper, and steel. In some embodiments, the coated substrate has an initial water contact angle of at least about 110° or at least about 115°. In some embodiments, the first evaporation source is vertically spaced apart a third vertical distance (h) and horizontally spaced apart a horizontal distance (l) from the innermost portion of second evaporation source such that the third vertical distance is less than l*tan θ, where θ is the smallest angle formed between a chamber floor and a line p that extends between the first evaporation source and a periphery of the outermost substrate of disposed in the substrate holder and that extends in a vertical plane that intersects at least a portion of the second evaporation source.

Yet another aspect of the present disclosure is a method of retrofitting a vacuum deposition chamber to have a raised resistance evaporator relative to a vacuum deposition chamber floor. In some embodiments, the method comprises installing a resistance evaporator comprising a crucible into an operational vacuum deposition chamber such that the crucible is disposed above the vacuum deposition chamber floor, where prior to the installation, the vacuum deposition chamber comprises another resistance evaporator crucible that is closer to the vacuum deposition chamber floor than the installed crucible. In some embodiments, installing the resistance evaporator comprises installing two conductive rods into an operational vacuum deposition chamber such that at least a portion of the two conductive rods extend upward relative to a vacuum deposition chamber floor, and coupling the crucible extend between the two conductive rods. In some embodiments, the two conductive rods have a length of between 20 cm to 70 cm.

BRIEF DESCRIPTION OF THE DRAWINGS

The following drawings illustrate by way of example and not limitation. For the sake of brevity and clarity, every feature of a given structure may not be labeled in every figure in which that structure appears. Identical reference numbers do not necessarily indicate an identical structure. Rather, the same reference number may be used to indicate a similar feature or a feature with similar functionality, as may non-identical reference numbers.

DETAILED DESCRIPTION

The terms "a" and "an" are defined as one or more unless this disclosure explicitly requires otherwise.

The terms "substantially," "approximately," and "about" are defined as being largely but not necessarily wholly what is specified (and include wholly what is specified) as understood by one of ordinary skill in the art. In any disclosed embodiment, the term "substantially," "approximately," or "about" may be substituted with "within [a percentage] of" what is specified, where the percentage includes 0.1, 1, 5, and 10 percent.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, any of the present devices, systems, and methods that "comprises," "has," "includes" or "contains" one or more elements possesses those one or more elements, but is not limited to possessing only those one or more elements. Likewise, an element of a device, system, or method that "comprises," "has," "includes," or "contains" one or more features possesses those one or more features, but is not limited to possessing only those one or more features. Additionally, terms such as "first" and "second" are used only to differentiate structures or features, and not to limit the different structures or features to a particular order.

Furthermore, a structure that is capable of performing a function or that is configured in a certain way is capable or configured in at least that way, but may also be capable or configured in ways that are not listed.

The feature or features of one embodiment may be applied to other embodiments, even though not described or illustrated, unless expressly prohibited by this disclosure or the nature of the embodiments.

Any of the present devices, systems, and methods can consist of or consist essentially of—rather than comprise/include/contain/have—any of the described elements and/or features and/or steps. Thus, in any of the claims, the term "consisting of" or "consisting essentially of" can be substituted for any of the open-ended linking verbs recited above, in order to change the scope of a given claim from what it would otherwise be using the open-ended linking verb.

Details associated with the embodiments described above and others are presented below.

Figure 1:
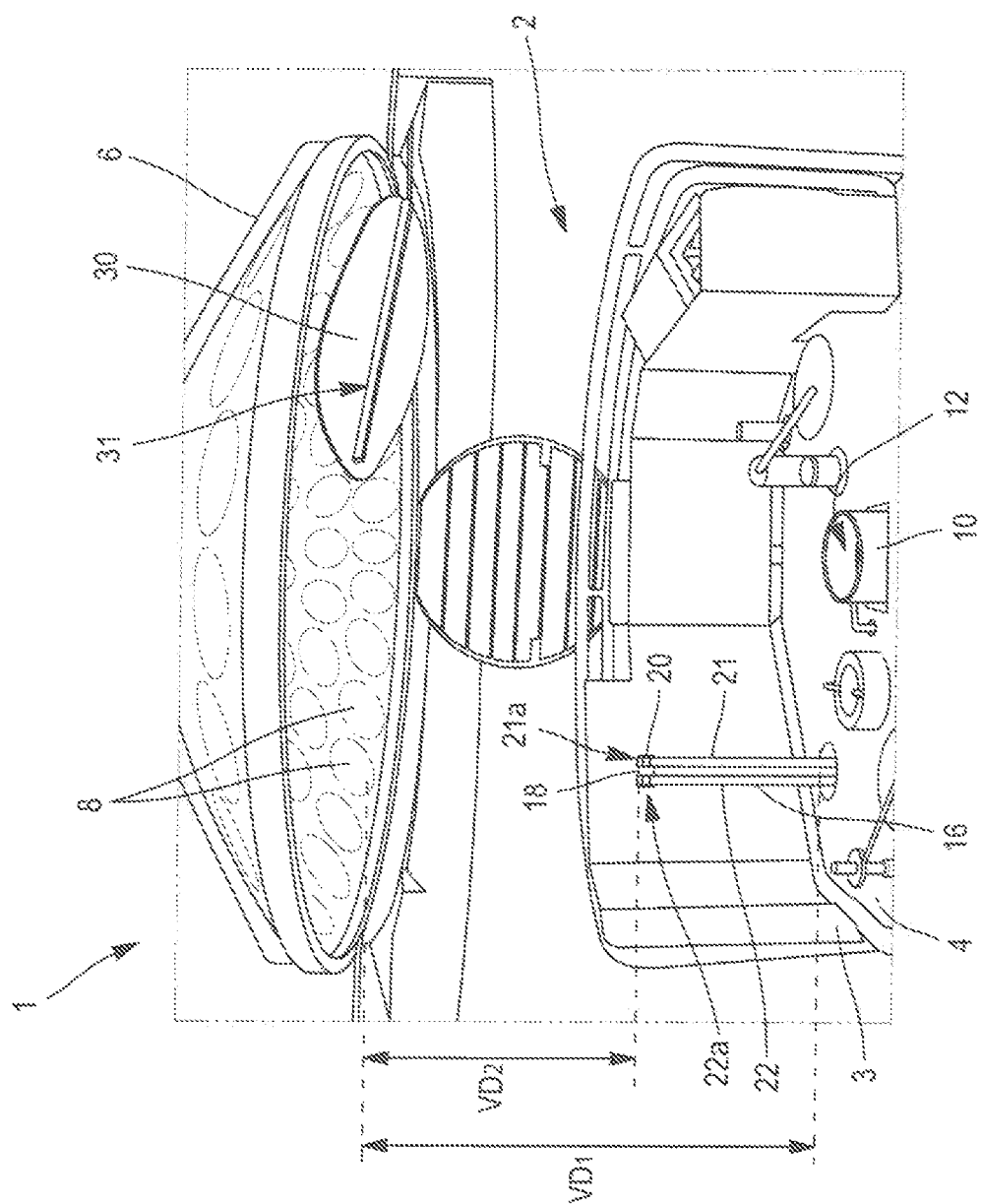
FIG. 1 illustrates a schematic perspective, interior view within a vacuum chamber of an embodiment of a vapor deposition apparatus.

Referring now to the drawings and more particularly to FIG. 1, shown there and designated by the reference numeral 1 is an embodiment of the present vapor deposition apparatus for coating one or more substrates. The vapor deposition apparatus is configured to apply at least two functional coatings, including a hydrophobic coating, to the one or more substrates. In the embodiments shown, vapor deposition apparatus 1 comprises a vacuum chamber 2 with a substrate holder 6 disposed in chamber 2 opposite a chamber floor 4, and a first evaporator 10 and a second evaporator 16 also disposed in chamber 2 below substrate holder 6. Substrate holder 6 is configured to receive and hold one or more substrates 8. In the illustrated embodiment, eyeglass lenses are the substrates to be coated.

In various embodiments, first evaporator 10 comprises a first evaporation source 12 and is configured to apply one of the at least two functional layers to a target side of at least one of substrates 8. In some embodiments, first evaporator 10 is configured for electron beam evaporation, ion-assisted evaporation, or ion beam sputtering. In some embodiments, first evaporator 10 can be configured to apply one or more layers of an anti-reflecfive coating. For example, first evaporator 10 can be configured to apply one or more metal oxide layers by electron beam evaporation. In some embodiments, first evaporator 10 can be configured to apply an anti-static layer, an anti-scratch layer, a mirror layer, a tinted/colored layer, and/or a hardening layer. Either (or any) side of substrate 8 can be the target side. In some embodiments, substrate holder 6 can be configured to flip or rotate substrate 8 so that the target side is switched to the other side of substrate 8 or so that the target is a different portion of substrate 8.

In some embodiments, apparatus 1 can further comprise a vapor distribution mask 30. Mask 30 is configured to block vapor from depositing on substrate 8 when substrate 8 is located behind mask 30. In such embodiments, second evaporation source 18 can be disposed in chamber 2 at a position that is not underneath and laterally spaced relative to mask 30. For example, if mask 30 is disposed on one side of vacuum chamber 2 (such as the right side as depicted in FIG. 1), then second evaporation source 18 can be disposed on the other side of vacuum chamber 2 (such as the left side as depicted in FIG. 1). More particularly, in some embodiments, if central region 31 of mask 30 is disposed generally at, e.g., a position that is 90 degrees relative to substrate holder 6, then second evaporation source 18 can be disposed such that it is generally 270 degrees relative to substrate holder 6. In some embodiments, mask 30 and the evaporation source 18 are spaced apart a lateral distance that can be at least 5 cm, 7 cm, 10 cm, 12 cm, 15 cm, 20 cm, 25 cm, 30 cm, 35 cm, 40 cm, 45 cm, 50 cm, or more.

Figure 2:
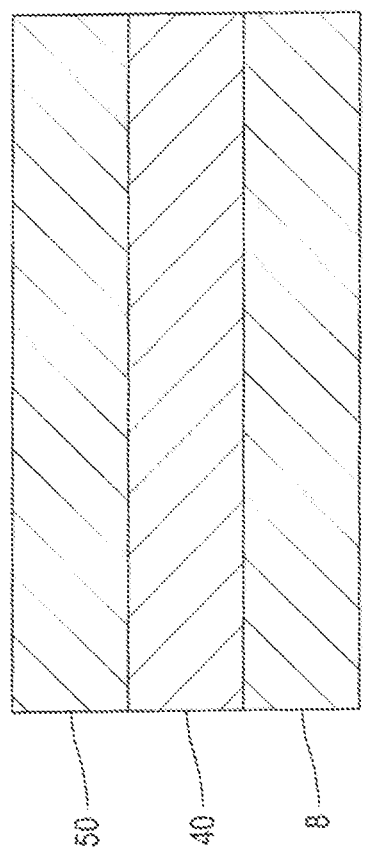
FIG. 2 illustrates a schematic of a substrate with two functional coatings applied thereon. Such coatings can be applied to the substrate with the apparatus shown in FIG. 1.

FIG. 2 shows a schematic of the substrate 8 with two functional coatings, e.g., an anti-reflective coating 40 and a hydrophobic coating 50. Such coatings 40, 50 can be applied to substrate 8 with the apparatus 1 shown in FIG. 1.

In various embodiments, second evaporator 16 comprises a second evaporation source 18 and is configured to evaporate a hydrophobic material so that the hydrophobic material forms a hydrophobic coating (e.g., an anti-soiling coating) on the target side of substrate 8. In some embodiments, the hydrophobic material comprises at least one fluorinated compound or more particularly, at least one silane, silazane or polysilazane type compound, carrying one or more fluorinated group(s), especially fluorinated hydrocarbon, perfluorinated carbon, fluorinated polyether groups, such as a $F_3C—(OC_3F_6)_{24}—O—(CF_2)_2-(CH_2)_2—O—CH_2—Si(OCH_3)_3$ or a perfluoropolyether group. For example, a fluorosilane-containing compound such as that contained in Optool™ DSX (a fluorinated resin from Daikin Industries comprising perfluoropropylene groups having the formula as given in U.S. Pat. No. 6,183,872). Other commercially available compositions that can be used for preparing hydrophobic coatings can include Optron® OF-210 and KY130® (having the formula as given in JP Patent No. 2005-187936). In some embodiments, the hydrophobic material could be a vaporized encapsulated material.

In various embodiments, second evaporator 16 is configured for resistance evaporation and comprises a heating vessel, such as a crucible 20 and two conductive rods 21, 22 that extend upward relative to chamber floor 4. In some embodiments, crucible 20 can be electrically coupled to each conductive rod 21, 22 at the first ends 21a, 22a of conductive rods 21, 22, which are nearer substrate 8 than the second ends (not shown) of conductive rods 21, 22. In various embodiments, crucible 20 comprises one or more of molybdenum, tantalum, tungsten, copper, and steel. Crucible 20 is configured to receive at least one hydrophobic material for applying a hydrophobic coating on substrate 8. In the embodiment shown, second evaporator 16 is shutter-less.

In some embodiments, second evaporator 16 is configured for resistance heating to cause evaporation. For example, crucible 20 can be traversable by an electric current and able to raise the temperature of the heating vessel by Joule effect. In some embodiments, second evaporator 16 can be configured to heat the hydrophobic material from a bottom of crucible 20. By heating from the bottom, better power control can be provided. In other embodiments, second evaporator 16 can be configured for electron beam heating, e.g., bombarding a hydrophobic material in crucible 20 with an electron beam from an electron beam gun.

The relative vertical position of the two evaporators 10, 16 is such that second evaporation source 18 is nearer to substrate 8 than the first evaporation source 12 but does not intersect with a vapor path between first evaporator 10 and substrate 8. More particularly, the vertical distance $VD_2$ between substrate 8 and second evaporation source 18 is X % of or less than X % of the vertical distance $VD_1$ between first evaporation source 12 and the same substrate, where X can be 90%, 80%, 75%, 70%, 65%. 60%, 55%, 50%, 45%, 40%, 35%, 30% 25%, 20%:

$$VD_2 \leq X\% * VD_1 \quad (1)$$

While second evaporation source 18 is nearer substrate 8 than first evaporation source 12, in some embodiments, there can be a limit to how close. In various embodiments, second evaporator 16 does not intersect with a vapor path between first evaporator 10 and substrate 8. This can be understood with reference to FIG. 3 and Equation (2) below.

Figure 3:
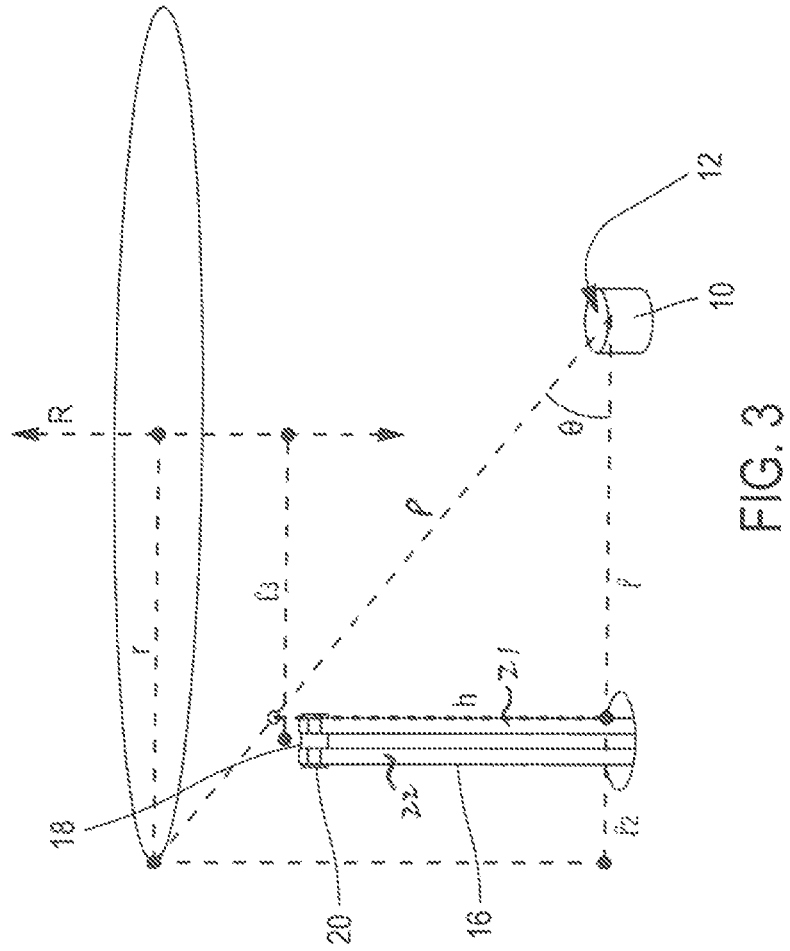
FIG. 3 illustrates a diagram of the geometric relationship between different elements shown in FIG. 1.

Referring to FIG. 3, vertical distance (h) is the height of the innermost portion of second evaporation source 18 above first evaporation source 12. In various embodiments, if second evaporation source 18 is too close to substrate 8 (i.e., h is too high), second evaporator 16 may intercept vapor from first evaporation source 12 intended for deposition on substrate 8 and interfere with the vapor deposition of another functional layer. The upper limit of vertical distance (h) can be represented by the following formula:

$$h < l * \tan \theta \quad (2)$$

Variable l is the horizontal distance between the innermost side of the first evaporation source 12 and the second evaporation source 18 and θ is the smallest angle formed between chamber floor 4 and a line p that extends between first evaporation source 12 and the periphery of the outermost substrate 8 of substrate holder 6 and that extends in a vertical plane that intersects at least a portion of second evaporation source 18. In some embodiments, horizontal distance l is at least 50% of the radius (r) of the rotation path of substrate or at least 25% of its widest spanning portion of substrate holder 6. In some embodiments, h is the highest value that still satisfies the inequality of Equation (2) or within 25%, 20%, 15%, or 10% of this highest value, yet still satisfying Equation (2). Stated in terms of $VD_2$, the lower limit of $VD_2$ can be represented by the following formula:

$$VD_2 = VD_1 - h \quad (3)$$

In various embodiments, substrate holder 6 is rotatable about axis (R). In some embodiments, radius (r) is perpendicular to axis (R) and extends between axis (R) to the periphery of the outermost substrate 8. In various embodiments, second evaporation source 18 is disposed below and spaced apart from substrate holder 6. In addition, in various embodiments, second evaporation source 18 is spaced apart from axis (R) at least a horizontal distance (depicted in FIG. 3 as $l_3$) that is greater than or equal to 50%, 60%, 70%, 80%, or 90% of the radius (r) of substrate holder. In some embodiments, second evaporator can be nearer a wall 3 defining vacuum chamber 2 than rotation axis (R) of substrate holder 6.

In various embodiments, the vertical length of conductive rods 21, 22 is such that the vertical distance (h) of evaporation source 18 (which is disposed in crucible 20) is less than l*tan θ, as described above. In some embodiments, the vertical length of conductive rods can be at least 20 cm, 25 cm, 30 cm, 35 cm, 40 cm, 45 cm, 50 cm, 55 cm, 60 cm, 65 cm, 70 cm, or any value therebetween.

In some embodiments, a method of vacuum depositing at least two functional coatings on a substrate, one of which is a hydrophobic coating, can comprise the steps of evaporating a first film forming material from a first evaporation source 12 as described herein, thereby depositing the evaporated first film forming material on a substrate located above the first evaporation source to form at least a portion of a first functional coating, such as an anti-reflective coating, on the substrate. The method further comprises evaporating a second film forming material from a second evaporation source as described herein, thereby depositing the evaporated second film forming materials on the substrate located above the second evaporation source to form a hydrophobic coating on the substrate. During the evaporation process, the first evaporation source 12 is positioned further from the substrate 8 than the second evaporation source 18 as described above. In some embodiments, the second vertical distance ($VD_2$) is X % or is less than X % of the first vertical distance ($VD_1$). In some embodiments, as described above, the vertical distance (h) of the innermost portion of second evaporation source 18 above first evaporation source 12 is less than l*tan θ.

In various embodiments, the position of the second evaporation source 18, as described herein, can facilitate the use of fewer amounts of hydrophobic material to form a hydrophobic coating of a certain thickness on a substrate compared to that which would be used if the hydrophobic material was vaporized from a location closer to chamber floor 4, such as close to the height of the first evaporation source 12, to form a coating of the same thickness. In various embodiments, evaporating the hydrophobic material from a height (h) that is within 10% of the highest value of h that satisfies the inequality of Equation (2) can use between 10%-60% less hydrophobic material than would be used if the hydrophobic material was vaporized from a location within 2 cm of the chamber floor, such as using less than 20%, 30%, 40%, 50%, or 60%, or any value or range therebetween, of hydrophobic material. Generally, the hydrophobic coating can be less than or equal to 50 nm thick, such as 45 nm, 40 nm, 35 nm, 30 nm, 25 nm, 20 nm, 17 nm, 15 nm, 12 nm, 10 nm, 9 nm, 8 nm, 7 nm, 6 nm, 5 nm, 4 nm, 3 nm, 2 nm, or 1 nm thick.

In various embodiments, the location of second evaporation source 18, as described herein, can yield a hydrophobic coating on substrate 8 that has an initial water contact angle of at least about 110°, such as 111°, 112°, 113°, 114°, 115°, 116°, 117°, 118°, or 119°. In various embodiments, the initial water contact angle of at least 115°.

In various embodiments, an existing vapor deposition apparatus can be reconfigured to have a raised second evaporator for applying a hydrophobic coating. For example, a method of retrofitting a vacuum deposition chamber to have a raised resistance evaporator relative to a vacuum deposition chamber floor can comprise the step of installing a resistance evaporator comprising a crucible into an operational vacuum deposition chamber such that the crucible is disposed above the vacuum deposition chamber floor, where prior to the installation, the vacuum deposition chamber comprises another resistance evaporator crucible that is closer to the vacuum deposition chamber floor than the installed crucible. In various embodiments, installing the resistance evaporator comprises installing two conductive rods, as described herein, into an operational vacuum deposition chamber such that at least a portion of the two conductive rods extends upward toward the substrate holder 6 relative to a vacuum deposition chamber floor 4 and coupling the crucible between the two conductive rods. In some embodiments, the other resistance evaporator present in vacuum chamber prior to installing the raised evaporator can be removed or inactivated, such as by decoupling from a power source.

EXAMPLES

I. Retrofitting a Satisloh 1200-DLX

A Satisloh 1200-DLX was reconfigured so that the thermal source was raised to be closer to the rotatable lens holder. First, the original resistance evaporator was removed and the rod slots were bridged. Next, the location of the new conductive rods was determined to be on the left side since the mask was on the right side of the vacuum chamber, and modifications to the floor of the vacuum chamber were made to accommodate for the rods extending through the floor. The slots at the new location were unbridged. The conductive rod power supply was reconfigured to supply power to the new conductive rods. Copper rods were installed into the unbridged slots. The copper rods were essentially a copy of the original rods but were 38 cm longer. The target height of the crucible was 51 cm above the chamber floor. For the Satisloh machine that was reconfigured, this height should be approximately the shortest distance to the lens without causing any shadowing.

II. Lens Coating and Lens Performance Tests

With the reconfigured Satisloh machine above, the DSX coating performance was tested. The substrates to be tested were 24 mm diameter glass lenses. Twelve lenses were placed in the domed substrate holder so that there were two rows of lenses that extended from the perimeter to the center.

Figure 4:
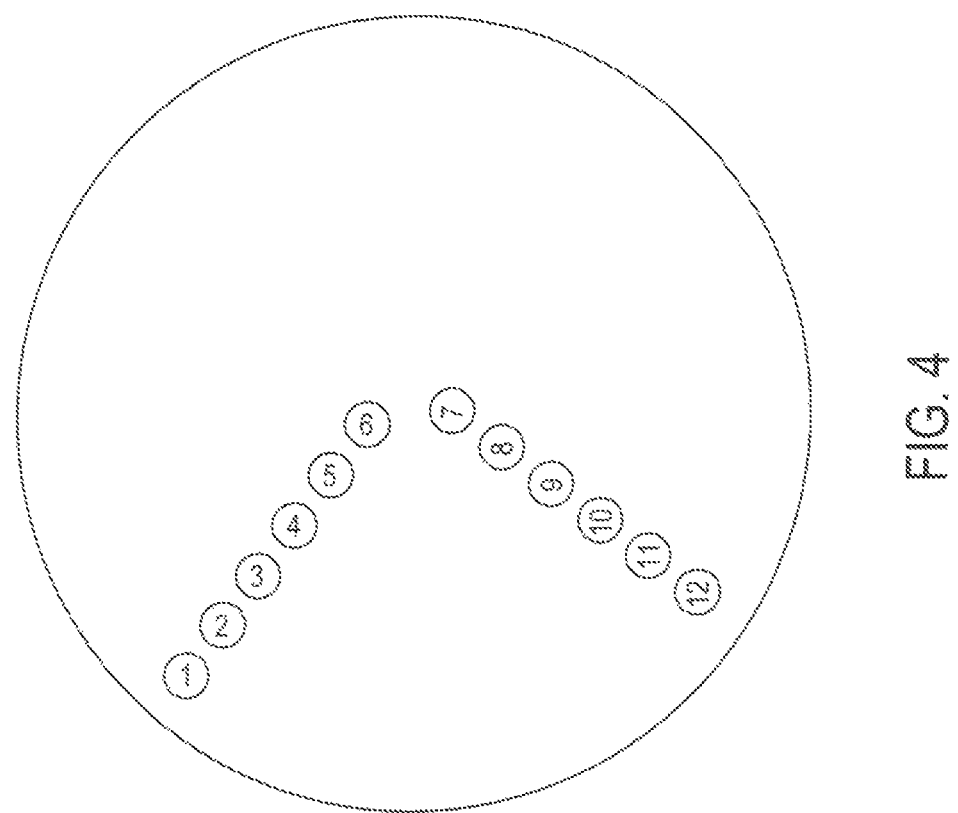
FIG. 4 illustrates one embodiment of a plurality of lenses arranged in a domed substrate holder for the DSX coating studies described in the example section.

FIG. 4 generally illustrates the layout of the lenses, and the number corresponds to the Lens # in Table 1 below. An anti-reflective stack having a thickness of 230 nm was deposited on one side of the lens. Next, a program was used to deposit approximately a 30 nm thick DSX monolayer on the anti-reflective stack. A 150 μL charge of DSX was placed in the crucible 20.

The thickness of the DSX layer was measured for each lens. Table 1 below shows that the distribution of the vapor is consistent across the span of the domed substrate holder, as evident by the consistency of the thickness of the DSX coating to each lens.

TABLE 1

DSX Vapor Distribution:

| Lens # | Lens Position | AR Thickness | Total Thickness | DSX Thickness |
|---|---|---|---|---|
| 1 | EXT | 500 | 528 | 28 |
| 2 | EXT/MID | 509 | 539 | 30 |
| 3 | MID | 507 | 537 | 30 |
| 4 | MID/INT | 509 | 539 | 30 |
| 5 | INT/MID | 504 | 535 | 31 |
| 6 | INT | 502 | 531 | 29 |
| 7 | INT | 493 | 523 | 30 |
| 8 | INT/MID | 492 | 522 | 30 |
| 9 | MID/INT | 498 | 528 | 30 |
| 10 | MID | 498 | 527 | 39 |
| 11 | EXT/MID | 499 | 528 | 29 |
| 12 | EXT | 493 | 520 | 27 |

Next, using approximately the same protocol for the distribution test, five different rounds of coating tests were done, spaced apart over a period of time, to evaluate the consistency of the water contact angle. The average (AVG) and standard deviation (STDEV) of the Rounds for each position were calculated. Table 2 shows that the water contact angle was generally consistent over these five rounds for each lens position.

TABLE 2

Water Contact Angle Study:

| | Lens Position | | | | |
|---|---|---|---|---|---|
| | Int | Int-Mid | Mid-Ext | Ext-Mid | Ext |
| Round 1 | 118.54 | 117.18 | 116.94 | 116.14 | 114.86 |
| Round 2 | 115.64 | 115.06 | 117.58 | 115.68 | 114.72 |
| Round 3 | 112.56 | 115.12 | 116.58 | 115.46 | 116.14 |
| Round 4 | 115.5 | 114.5 | 115.5 | 115.2 | 114.82 |
| Round 5 | 114.88 | 115.58 | 116.18 | 115 | 114.74 |
| AVG | 115.42 | 115.49 | 116.56 | 115.50 | 115.06 |
| STDEV | 2.14 | 1.02 | 0.78 | 0.44 | 0.61 |

The above specification and examples provide a complete description of the structure and use of exemplary embodiments. Although certain embodiments have been described above with a certain degree of particularity, or with reference to one or more individual embodiments, those skilled in the art could make numerous alterations to the disclosed embodiments without departing from the scope of this invention. As such, the illustrative embodiments of the present vapor deposition apparatuses and methods are not intended to be limiting. Rather, the present devices, systems, and methods include all modifications and alternatives falling within the scope of the claims, and embodiments other than those shown may include some or all of the features of the depicted embodiments. For example, components may be combined as a unitary structure and/or connections may be substituted. Further, where appropriate, aspects of any of the examples described above may be combined with aspects of any of the other examples described to form further examples having comparable or different properties and addressing the same or different problems. Similarly, it will be understood that the benefits and advantages described above may relate to one embodiment or may relate to several embodiments.

The claims are not to be interpreted as including means-plus- or step-plus-function limitations, unless such a limitation is explicitly recited in a given claim using the phrase(s) "means for" or "step for," respectively.

The invention claimed is:

1. A method of retrofitting a vacuum deposition chamber of an apparatus for coating optical substrates suitable for successively depositing on each substrate an antireflective coating and a hydrophobic coating, in order to have a raised resistance evaporator relative to a vacuum deposition chamber floor, the method comprising, installing a resistance evaporator comprising a crucible into an operational vacuum deposition chamber such that the crucible is disposed above the vacuum deposition chamber floor, where prior to the installation, the vacuum deposition chamber comprises another resistance evaporator crucible that is closer to the vacuum deposition chamber floor than the installed crucible, such that there is a height of an innermost portion of the installed crucible above said another resistance evaporator crucible that is greater than zero.

2. The method of claim 1, where installing the resistance evaporator comprises installing two conductive rods into an operational vacuum deposition chamber such that at least a portion of the two conductive rods extend upward relative to a vacuum deposition chamber floor and coupling the crucible between the two conductive rods.

3. The method of claim 2, where the two conductive rods have a length between 20 cm to 70 cm.

* * * * *

UNITED STATES PATENT AND TRADEMARK OFFICE
CERTIFICATE OF CORRECTION

PATENT NO. : 10,844,472 B2  
APPLICATION NO. : 16/690545  
DATED : November 24, 2020  
INVENTOR(S) : McCrady et al.

Page 1 of 1

It is certified that error appears in the above-identified patent and that said Letters Patent is hereby corrected as shown below:

On the Title Page

Item (73) Assignee:
Delete "(Compagnie Generale d'Optique)".

Signed and Sealed this  
Second Day of February, 2021

Drew Hirshfeld  
*Performing the Functions and Duties of the*  
*Under Secretary of Commerce for Intellectual Property and*  
*Director of the United States Patent and Trademark Office*